United States Patent
Sakaida et al.

(10) Patent No.: US 11,024,665 B2
(45) Date of Patent: Jun. 1, 2021

(54) IMAGING DEVICE AND MANUFACTURING METHOD THEREOF

(71) Applicants: Panasonic Corporation, Osaka (JP); TowerJazz Panasonic Semiconductor Co., Ltd., Toyama (JP)

(72) Inventors: Ryota Sakaida, Toyama (JP); Yoshihiro Sato, Osaka (JP); Kosaku Saeki, Toyama (JP); Hideki Doshita, Kyoto (JP); Takeshi Yamashita, Toyama (JP)

(73) Assignees: PANASONIC CORPORATION, Osaka (JP); TOWERJAZZ PANASONIC SEMICONDUCTOR CO., LTD., Toyama (JP)

( * ) Notice: Subject to any disclaimer, the term of this patent is extended or adjusted under 35 U.S.C. 154(b) by 0 days.

(21) Appl. No.: 16/599,794

(22) Filed: Oct. 11, 2019

(65) Prior Publication Data

US 2020/0119098 A1    Apr. 16, 2020

(30) Foreign Application Priority Data

Oct. 15, 2018 (JP) .............................. JP2018-194563

(51) Int. Cl.
  *H01L 27/146* (2006.01)
(52) U.S. Cl.
  CPC .. *H01L 27/14665* (2013.01); *H01L 27/14614* (2013.01); *H01L 27/14636* (2013.01); *H01L 27/14692* (2013.01); *H01L 27/14698* (2013.01)

(58) Field of Classification Search
  CPC ......... H01L 27/14603; H01L 27/14609; H01L 27/14612; H01L 27/14614; H01L 27/14636; H01L 27/14665
  See application file for complete search history.

(56) References Cited

U.S. PATENT DOCUMENTS

| 6,307,251 | B1  | 10/2001 | Sekikawa et al. |
| 2002/0041005 | A1 | 4/2002 | Sekikawa et al. |
| 2004/0089883 | A1* | 5/2004 | Kim ................. H01L 27/14609 257/222 |
| 2007/0023764 | A1 | 2/2007 | Kim |

(Continued)

FOREIGN PATENT DOCUMENTS

| JP | 9-331061 | 12/1997 |
| JP | 2000-243979 | 9/2000 |

(Continued)

*Primary Examiner* — Zandra V Smith
*Assistant Examiner* — Molly K Reida
(74) *Attorney, Agent, or Firm* — Wenderoth, Lind & Ponack, L.L.P.

(57) ABSTRACT

An imaging device according to one aspect of the present disclosure includes: a semiconductor substrate; and pixels. Each of the pixels includes: a photoelectric converter that converts incident light into electric charge; a diffusion region provided in the semiconductor substrate and electrically connected to the photoelectric converter; a first transistor including a gate, and the diffusion region as one of a source and a drain; and a plug that is directly connected to the diffusion region, is electrically connected to the photoelectric converter, and includes a semiconductor. The height of the plug and the height of the gate from the surface of the semiconductor substrate are equal to each other.

15 Claims, 9 Drawing Sheets

(56) References Cited

U.S. PATENT DOCUMENTS

| | | | |
|---|---|---|---|
| 2009/0179293 A1 | 7/2009 | Shim et al. | |
| 2014/0103400 A1 | 4/2014 | Sakata et al. | |
| 2015/0054113 A1* | 2/2015 | Suzuki | H01L 21/76889 |
| | | | 257/459 |
| 2015/0076500 A1* | 3/2015 | Sakaida | H01L 51/441 |
| | | | 257/59 |
| 2018/0083004 A1 | 3/2018 | Sato et al. | |
| 2019/0244959 A1 | 8/2019 | Sato et al. | |

FOREIGN PATENT DOCUMENTS

| | | |
|---|---|---|
| JP | 2004-80030 | 3/2004 |
| JP | 2007-36244 | 2/2007 |
| JP | 2009-164604 | 7/2009 |
| JP | 2018-50035 | 3/2018 |
| WO | 2012/176390 | 12/2012 |

* cited by examiner

IMAGING DEVICE AND MANUFACTURING METHOD THEREOF

CROSS REFERENCE TO RELATED APPLICATION

The present application is based on and claims priority of Japanese Patent Application No. 2018-194563 filed on Oct. 15, 2018. The entire disclosure of the above-identified application, including the specification, drawings and claims is incorporated herein by reference in its entirety.

FIELD

One or more exemplary embodiments disclosed herein relate generally to an imaging device and a manufacturing method thereof.

BACKGROUND

Charge-coupled device (CCD) image sensors and complementary metal oxide semiconductor (CMOS) image sensors are widely used for apparatuses such as digital cameras. These image sensors each have photodiodes formed in a semiconductor substrate.

There has been proposed an imaging device having a structure such that a photoelectric converter including photoelectric conversion layers are disposed above a semiconductor substrate, as disclosed in Patent Literature (PTL) 1, for example. An imaging device having such a structure is also referred to as a laminated imaging device. In the laminated imaging device, charge generated by photoelectric conversion is accumulated in a charge accumulation region (also referred to as "floating diffusion (FD)") provided in a semiconductor substrate. A signal that is in accordance with the amount of charge accumulated in the charge accumulation region is read out via a CCD or CMOS circuit that includes transistors and is formed on the semiconductor substrate.

CITATION LIST

Patent Literature

PTL 1: Japanese Unexamined Patent Application Publication No. 2009-164604

SUMMARY

Technical Problem

Plugs connected to a photoelectric converter are connected to charge accumulation regions provided in a semiconductor substrate. When wirings are not in good contact with the plugs and each of the gate electrodes of transistors formed on the semiconductor substrate, unnecessary resistance is generated in some cases. The generation of such unnecessary resistance decreases the amount of signal charge accumulated or read out and degrades the quality of pictures captured by an imaging device in some cases.

In view of this, one non-limiting and exemplary embodiment of the present disclosure provides: an imaging device including wirings which are in good contact with the gates of transistors and plugs connected to charge accumulation regions; and a manufacturing method of the imaging device.

Solution to Problem

According to one non-limiting and exemplary embodiment of the present disclosure, the following techniques are provided.

In one general aspect, the techniques disclosed here feature an imaging device including a semiconductor substrate and pixels. Each of the pixels includes: a photoelectric converter that converts incident light into electric charge; a diffusion region provided in the semiconductor substrate and electrically connected to the photoelectric converter; a first transistor including a gate, and the diffusion region as one of a source and a drain; and a plug that is directly connected to the diffusion region, is electrically connected to the photoelectric converter, and includes a semiconductor, and a height of the plug and a height of the gate from a surface of the semiconductor substrate are equal to each other.

In one general aspect, the techniques disclosed here feature a method for manufacturing an imaging device. The method includes: a first process of forming a semiconductor film above a semiconductor substrate including a diffusion region; a second process of forming (i) a plug directly connected to the diffusion region and (ii) a gate of a first transistor including the diffusion region as one of a source and a drain, by removing a portion of the semiconductor film; and a third process of forming a photoelectric converter that is electrically connected to the diffusion region and the plug, and converts incident light into electric charge. A height of the plug and a height of the gate from a surface of the semiconductor substrate are equal to each other.

General or specific aspects of the present disclosure may be realized as an element, device, module, system, method, or any given combination thereof.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

An imaging device and a manufacturing method thereof according to one or more exemplary embodiments or features disclosed herein can provide wirings which are in good contact with the gates of transistors and plugs connected to charge accumulation regions.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Overview of Present Disclosure

Figure 1:
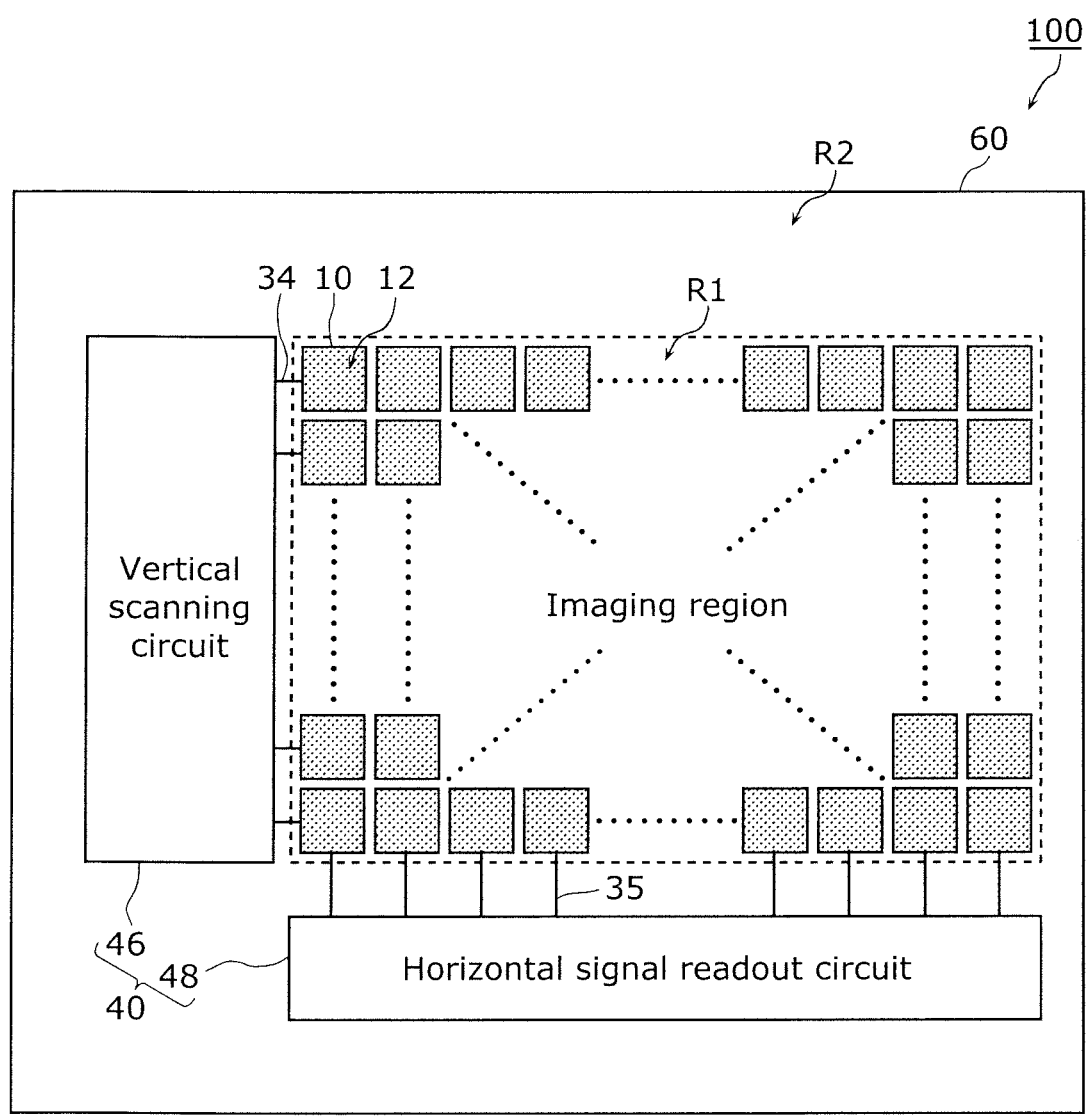
FIG. 1 is a diagram illustrating a configuration of an imaging device according to an exemplary embodiment.

An overview of aspects of the present disclosure is as described below.

According to an exemplary embodiment disclosed herein, an imaging device according to one aspect of the present disclosure is an imaging device including a semiconductor substrate and pixels. Each of the pixels includes: a photoelectric converter that converts incident light into electric charge; a diffusion region provided in the semiconductor substrate and electrically connected to the photoelectric converter; a first transistor including a gate, and the diffusion region as one of a source and a drain; and a plug that is directly connected to the diffusion region, is electrically connected to the photoelectric converter, and includes a semiconductor, and a height of the plug and a height of the gate from a surface of the semiconductor substrate are equal to each other.

With such features, since the height of plugs connected to charge accumulation regions and the height of the gates of transistors are mutually equal, portions where wirings are connected within a pixel become less uneven. Owing to this, it is possible to perform with accuracy a patterning process for a wiring structure and an insulating layer after the formation of the plugs and the gates. Accordingly, it is possible to connect a highly reliable wiring structure to the plugs and the gates. According to the present aspect, an imaging device having good contacts with plugs connected to charge accumulation regions and the gates of transistors can be realized.

For example, the plug and the gate may have compositions identical to each other.

With this feature, when a wiring structure of wirings composed of the same material as that used for plugs and gates is connected to each of the plugs and the gates, it is possible for the plugs and the gates to have mutually identical contact characteristics. In other words, it is possible to easily achieve good contacts with each of the plugs and the gates.

For example, the plug may include: a first layer including a semiconductor; and a second layer disposed on the first layer and including a semiconductor.

For example, the gate may include: a third layer including a semiconductor; and a fourth layer disposed on the third layer and including a semiconductor.

For example, the first layer and the third layer may have compositions identical to each other, and the second layer and the fourth layer have compositions identical to each other.

With such features as described above, when a wiring structure of wirings composed of the same material as that used for plugs and gates is connected to each of the plugs and the gates, it is possible for the plugs and the gates to have mutually identical contact characteristics. In other words, it is possible to easily achieve good contacts with the plugs and the gates.

For example, the first layer, the second layer, the third layer, and the fourth layer may have compositions identical to one another.

With this feature, when a wiring structure of wirings composed of the same material as that used for plugs and gates is connected to each of the plugs and the gates, it is possible for the plugs and the gates to have mutually identical contact characteristics. In other words, it is possible to easily achieve good contacts with each of the plugs and the gates.

For example, the first layer may include a through-hole, and the second layer may be directly connected to the diffusion region via the through-hole.

With this feature, a second semiconductor layer that is located in the upper layer is connected to a diffusion region. Therefore, enhancing the conductivity of the second semiconductor layer makes it possible to achieve good contacts both with a plug and the diffusion region at the same time.

According to an exemplary embodiment disclosed herein, a method for manufacturing an imaging device according to one aspect of the present disclosure includes: a first process of forming a semiconductor film above a semiconductor substrate including a diffusion region; a second process of forming (i) a plug directly connected to the diffusion region and (ii) a gate of a first transistor including the diffusion region as one of a source and a drain, by removing a portion of the semiconductor film; and a third process of forming a photoelectric converter that is electrically connected to the diffusion region and the plug, and converts incident light into electric charge. A height of the plug and a height of the gate from a surface of the semiconductor substrate are equal to each other.

With such a method, since the height of plugs connected to charge accumulation regions and the height of the gates of transistors are mutually equal, portions where wirings are connected within a pixel become less uneven. Owing to this, it is possible to perform with accuracy a patterning process for a wiring structure and an insulating layer after the formation of the plugs and the gates. Accordingly, it is possible to connect a highly reliable wiring structure to the plugs and the gates. According to the present aspect, an imaging device having good contacts with the gates of transistors and plugs connected to charge accumulation regions can be manufactured.

For example, the first process may include: a fourth process of forming a first semiconductor film on an insulating film disposed on the semiconductor substrate; a fifth process of forming a contact hole by removing a portion of the insulating film and a portion of the first semiconductor film which are located in a first region overlapping the diffusion region in a plan view; and a sixth process of forming a second semiconductor film in the contact hole and on the first semiconductor film. In the second process, the plug and the gate may be formed by removing portions of the first semiconductor film and portions of the second semiconductor film, which are located in a second region different from the first region.

In this way, forming a semiconductor film in two stages makes it possible to reduce the thickness of the first semiconductor film, the portions of which are to be removed when contact holes to the diffusion regions are formed. Since this can enhance control in etching, it is possible to reduce damages to a semiconductor substrate.

For example, in the fifth process, the portion of the first semiconductor film in the first region may be removed by dry etching and the portion of the insulating film in the first region may be removed by wet etching.

In this way, removing the insulating film by wet etching makes it possible to reduce damages to the diffusion regions. Accordingly, leak currents to or from the diffusion regions can be inhibited.

For example, the first process may further include a seventh process of doping the first semiconductor film and the second semiconductor film with first conductivity type impurity, which is performed after the sixth process.

With this process, since it is possible to enhance the conductivity of the first semiconductor film, contact resistance can be reduced.

For example, the first process may further include a seventh process of doping the first semiconductor film with first conductivity type impurity, which is performed between the fourth process and the fifth process.

With this process, since it is possible to enhance the conductivity of the first semiconductor film, contact resistance can be reduced.

For example, the first process may further include an eighth process of doping the second semiconductor film with the first conductivity type impurity, which is performed after the sixth process.

With this process, since it is possible to enhance the conductivity of the second semiconductor film, contact resistance can be reduced.

For example, the first process may further include a ninth process of heating the semiconductor substrate, which is performed later than the seventh process.

With this process, since it is possible to allow impurity, with which the first semiconductor film and/or the second semiconductor film have/has been doped, to be diffused through the films/film, it is possible to enhance the conductivities/conductivity of the first semiconductor film and/or the second semiconductor film.

For example, the first semiconductor film and the second semiconductor film may be each a polysilicon film.

With this feature, since it is possible to inhibit the diffusion of metals to, for instance, diffusion regions or an insulating film more than the case of using metal conductive films for the first and second semiconductor films, it is possible to inhibit the occurrence of leak current.

The following describes in detail exemplary embodiments of the present disclosure with reference to the drawings. Note that each of the exemplary embodiments described below shows a general or specific example. The numerical values, shapes, materials, structural elements, the arrangement and connection of the structural elements, steps, the processing order of the steps, etc. shown in the following exemplary embodiments are mere examples, and therefore do not limit the scope of the appended Claims and their equivalents. Various aspects described herein may be combined with each other as long as no contradiction occurs. Among the structural elements in the following exemplary embodiments, structural elements not recited in any one of the independent claims are described as arbitrary structural elements. In the drawings, like reference signs are assigned to elements having substantially identical functions, and overlapping descriptions thereof are omitted or simplified.

Each of the elements illustrated in the drawings is a schematic illustration for promoting the understanding of the present disclosure, and dimensional ratio and external appearance of the element may differ from its actual ratio and appearance. In other words, the drawings are presented schematically and are not necessarily precise illustrations. Accordingly, scale sizes in the drawings, for example, are not necessarily the same.

A term such as "parallel" or "equal" representing a relationship between elements and a term such as "circular" or "quadrilateral" representing the form of an element, as well as a numerical range are used in the present specification. Such terms and range are each an expression not representing only a strict meaning of the term or range, but implying that a substantially same range, e.g., a range that includes even a difference as small as a few percentage points, is connoted in the term or range.

In the present specification, terms such as "above" and "below" do not indicate an upward direction (vertically upward) and a downward direction (vertically downward) defined in an absolute spatial recognition, respectively, but employed as terms defined by a relative positional relationship based on an order in which elements are laminated in a laminated structure. Specifically, a light-receiving side at which an imaging device receives light is defined as "above" and a side opposite to the light-receiving side is defined as "below". Likewise, "upper phase" of each of the elements is defined as a phase facing the light-receiving side of the imaging device and "lower phase" of each of the elements is defined as a phase facing the side opposite to the light-receiving side. Note that these terms such as "above", "below", "upper phase", and "lower phase" are used for specifying a positional relationship between elements and are not intended to limit the posture of the imaging device when used. The terms "above" and "below" are used not only when two elements are disposed spaced apart from each other and another element is placed between the two elements, but also when two elements are disposed in tight contact with each other and actually contact each other. In the present specification, the term "in a plan view" refers to when viewed in a direction vertical to a semiconductor substrate.

Embodiment

FIG. 1 is a diagram illustrating a configuration of an imaging device according to this embodiment. Imaging device 100 according to this embodiment includes peripheral circuits 40 and pixels 10 formed on semiconductor substrate 60, as illustrated in FIG. 1. Each of pixels 10 includes photoelectric converter 12 disposed above semiconductor substrate 60. In other words, laminated imaging device 100 will be described as one example of the imaging device according to the present disclosure.

In the example illustrated in FIG. 1, pixels 10 are disposed in a matrix of m rows and n columns. Here, n and m are each an integer of at least 2. Imaging region R1 is formed by, for example, two-dimensionally arranging pixels 10 on semiconductor substrate 60. As described above, each of pixels 10 includes photoelectric converter 12 disposed above semiconductor substrate 60. Imaging region R1 is therefore defined as a region of semiconductor substrate 60, which is covered by photoelectric converters 12. Note that in FIG. 1, photoelectric converters 12 of pixels 10 are illustrated as being spatially separated from one another with the view to facilitate the explanation thereof, but may be disposed above semiconductor substrate 60 without any space between photoelectric converters 12.

The number and disposition of pixels 10 are not limited to the example illustrated. The number of pixels 10 included in imaging device 100 may be one, for instance. In this example, the center of each pixel 10 is positioned on each of lattice points of a tetragonal lattice, but the disposition of pixels 10 need not be limited as such. Pixels 10 may be disposed so that the center of each pixel 10 is positioned, for example, on a triangle or hexagonal lattice. If pixels 10 are arranged one-dimensionally, for example, imaging device 100 is usable as a line sensor.

In the configuration illustrated in FIG. 1, peripheral circuits 40 include vertical scanning circuit (also referred to as "row scanning circuit") 46 and horizontal signal readout circuit (also referred to as "column scanning circuit") 48. Vertical scanning circuit 46 has a connection to address signal line 34 provided for each row of pixels 10. Horizontal signal readout circuit 48 has a connection to vertical signal line 35 provided for each column of pixels 10. These circuits are disposed in peripheral region R2 outside imaging region R1, as schematically illustrated in FIG. 1. Peripheral circuits 40 may further include a signal processing circuit, an output circuit, a control circuit, and a power supply for supplying each pixel 10 with a predetermined voltage. Part of peripheral circuits 40 may be disposed on another substrate different from semiconductor substrate 60 on which pixels 10 are formed.

Figure 2:
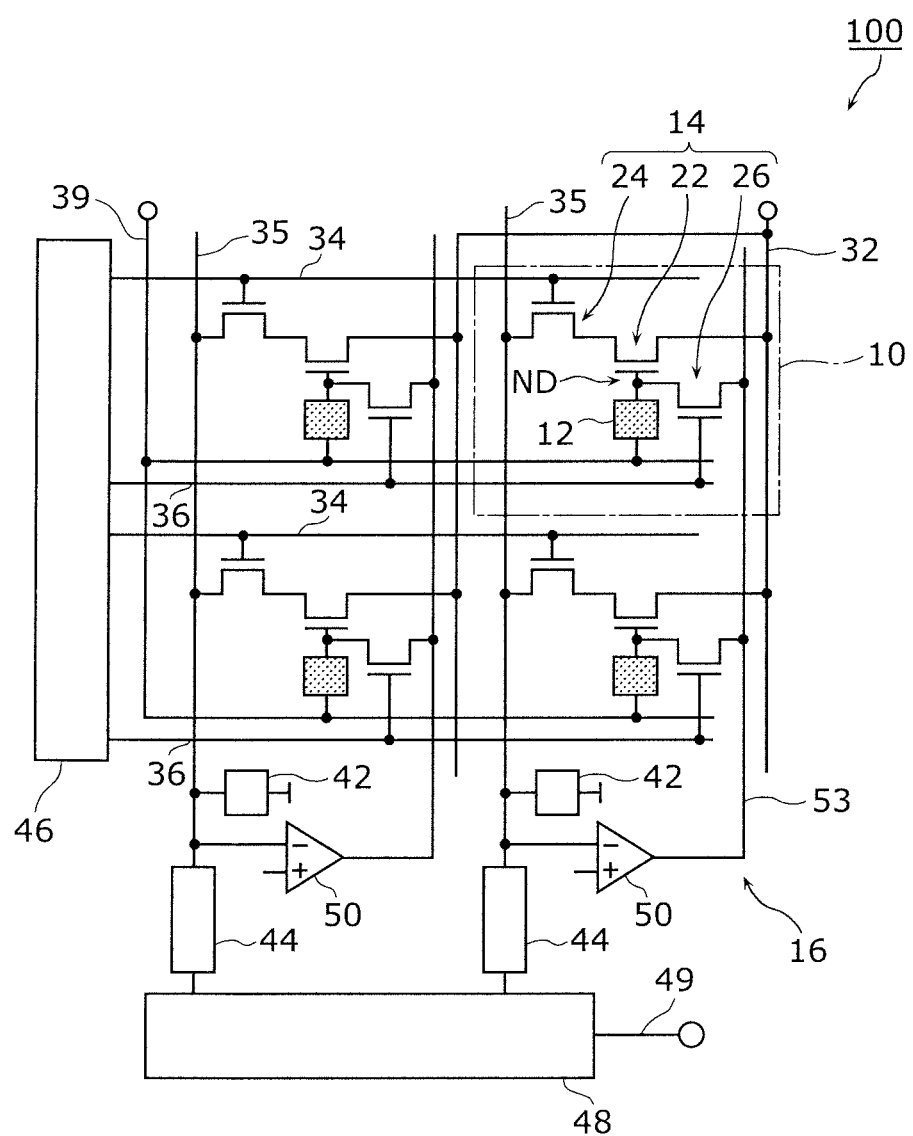
FIG. 2 is a diagram illustrating a circuit configuration of the imaging device according to the exemplary embodiment.

FIG. 2 is a diagram illustrating a circuit configuration of imaging device 100 according to this embodiment. FIG. 2 illustrates four pixels 10, among pixels 10 illustrated in FIG. 1, which are arranged in two rows and two columns, in order to prevent the illustration from becoming complex.

Upon receiving incident light, photoelectric converter 12 in each pixel 10 generates positive and negative charges that are electron-hole pairs, typically. Photoelectric converter 12 in each pixel 10 has a connection to accumulation control line 39, and a predetermined voltage is applied to accumulation control line 39 when imaging device 100 is in operation. The application of the predetermined voltage to accumulation control line 39 makes it possible to selectively accumulate, in a charge accumulation region, one of the positive and negative charges generated by photoelectric conversion. The following illustrates the case where positive charge, out of positive and negative charges generated by photoelectric conversion, is used as signal charge.

Each pixel 10 includes signal detection circuit 14 electrically connected to photoelectric converter 12. In the configuration illustrated in FIG. 2, signal detection circuit 14 includes amplifier transistor (also referred to as "readout transistor") 22 and reset transistor 26. In this example, signal detection circuit 14 further includes address transistor (also referred to as "row selection transistor") 24. As will be described in detail with reference to the drawings later on, amplifier transistor 22, reset transistor 26, and address transistor 24 in signal detection circuit 14 typically are field effect transistors (FETs) formed on semiconductor substrate 60 that supports photoelectric converters 12. The following illustrates an example of using N-channel metal oxide semiconductor (MOS) transistors as transistors unless explicitly stated otherwise. Note that which of two diffusion layers in an FET is a source or a drain is determined based on the polarity of the FET and the level of electric potential. For this reason, which of the two diffusion layers is a source or a drain may vary depending on the operating state of the FET.

The gate of amplifier transistor 22 is electrically connected to photoelectric converter 12, as schematically illustrated in FIG. 2. Signal charge generated by photoelectric converter 12 is accumulated in a charge accumulation region connected to charge accumulation node (also referred to as "floating diffusion node") ND between photoelectric converter 12 and amplifier transistor 22. Note that charge accumulation node ND is equivalent to the charge accumulation region and wirings electrically connecting the charge accumulation region, the gate of amplifier transistor 22, and the lower electrode of photoelectric converter 12.

The drain of amplifier transistor 22 is connected to power wiring 32 for supplying each pixel 10 with predetermined power voltage VDD when imaging device 100 is in operation. A power supply (not illustrated in the drawing) connected to power wiring 32 is also referred to as a source follower power supply. Power voltage VDD is, for example, 3.3 V or so, but is not limited to such. Amplifier transistor 22 outputs signal voltage that is in accordance with the amount of signal charge generated by photoelectric converter 12. The source of amplifier transistor 22 is connected to the drain of address transistor 24.

Vertical signal line 35 is connected to the source of address transistor 24. As illustrated in FIG. 1 and FIG. 2, vertical signal line 35 is provided for each column of pixels 10, and load circuit 42 and column signal processing circuit (also referred to as "row signal accumulation circuit") 44 are connected to each of vertical signal lines 35. Load circuit 42, together with amplifier transistor 22, forms a source follower circuit.

Address signal line 34 is connected to the gate of address transistor 24. Address signal line 34 is provided for each row of pixels 10. Address signal line 34 is connected to vertical scanning circuit 46, and vertical scanning circuit 46 applies, to address signal line 34, a row selection signal for controlling on and off of address transistor 24. With this, a target row to be read out is scanned in a vertical direction (also referred to as "column direction") and the target row is selected. Vertical scanning circuit 46 is capable of reading out, to the corresponding vertical signal line 35, an output of amplifier transistor 22 in pixel 10 that has been selected, by controlling on and off of address transistor 24 via address signal line 34. The disposition of address transistor 24 is not limited to the example illustrated in FIG. 2, and address transistor 24 may be placed between the drain of amplifier transistor 22 and power wiring 32.

The signal voltage which has been output from pixel 10 to vertical signal line 35 via address transistor 24 is input to the corresponding column signal processing circuit 44 among a plurality of column signal processing circuits 44 provided, corresponding to vertical signal lines 35, for each row of pixels 10. Column signal processing circuit 44 and load circuit 42 may constitute part of peripheral circuits 40 mentioned above.

Column signal processing circuit 44 performs, for instance, analog-digital conversion (referred to as "AD conversion") and noise suppression signal processing as represented by correlated double sampling. Column signal processing circuit 44 is connected to horizontal signal readout circuit 48. Horizontal signal readout circuit 48 sequentially reads out signals from column signal processing circuits 44 to horizontal common signal line 49.

In the configuration illustrated in FIG. 2, signal detection circuit 14 includes reset transistor 26 whose drain is connected to charge accumulation node ND. Reset signal line 36 having a connection to vertical scanning circuit 46 is connected to the gate of reset transistor 26. Reset signal line 36 is provided for each row of pixels 10 as is the case of address signal line 34. Vertical scanning circuit 46 is capable of selecting, in units of rows, target pixels 10 to be reset, by applying a row selection signal to address signal line 34. Vertical scanning circuit 46 is also capable of turning on reset transistors 26 of the selected row by applying, via reset signal line 36, a reset signal for controlling on and off of reset transistor 26 to reset the gate of reset transistor 26. By reset transistor 26 being turned on, the electric potential of charge accumulation node ND is reset.

In this example, the source of reset transistor 26 is connected to one of feedback lines 53 provided one for each column of pixels 10. Namely, in the example, charge accumulation node ND is supplied with the voltage of feedback line 53 as a reset voltage for resetting the charge of photoelectric converter 12. Here, feedback line 53 is connected to an output terminal of the corresponding one of inverting amplifiers 50 provided one for each column of pixels 10. Inverting amplifiers 50 may constitute part of peripheral circuits 40 mentioned above.

One of the columns of pixels 10 is focused here. The inverting input terminal of inverting amplifier 50 is connected to vertical signal line 35 of that column, as illustrated in FIG. 2. The output terminal of inverting amplifier 50 is connected, via feedback line 53, to at least one pixel 10 that belongs to that column. When imaging device 100 is in operation, the non-inverting input terminal of inverting amplifier 50 is supplied with predetermined voltage Vref. By selecting one of at least one pixel 10 that belongs to that column and turning on both address transistor 24 and reset transistor 26, a feedback path allowing an output of the selected pixel 10 to pass as a negative feedback is formed. The formation of the feedback path converges the voltage of vertical signal line 35 to input voltage Vref applied to the non-inverting input terminal of inverting amplifier 50. Stated differently, with the formation of the feedback path, the voltage of charge accumulation node ND is reset to a voltage such that the voltage of vertical signal line 35 becomes voltage Vref. A power voltage or a voltage at any given level within the range of a ground voltage may be used as voltage Vref. Voltage Vref is, for example, in the range from 0 V to 3.3 V, inclusive. Voltage Vref is, for example, a positive voltage of 1 V or approximately 1 V. Inverting amplifier 50 may be also referred to as "feedback amp". Imaging device 100 thus includes feedback circuit 16 including inverting amplifier 50 as part of the feedback path.

As is well known, with turning on or off of a transistor, thermal noise referred to as kTC noise is generated. The noise generated due to turning on or off of reset transistor 26 is referred to as reset noise. The reset noise generated due to turning reset transistor 26 off after having reset the electric potential of a charge accumulation region might remain in the charge accumulation region in which signal charge has not been accumulated. The reset noise generated due to the turning off of reset transistor 26, however, can be reduced by utilizing feedback circuit 16. The detail of the inhibition of reset noise achieved by utilizing feedback circuit 16 is described in PTL 1. The entirety of the disclosure set forth in PTL 1 is incorporated herein for reference purposes.

In the configuration illustrated in FIG. 2, an alternating component of thermal noise is fed back to the source of reset transistor 26. With the configuration illustrated in FIG. 2, since the feedback path is formed until immediately before the time when reset transistor 26 is turned off, it is possible to reduce reset noise generated due to turning off of reset transistor 26.

Figure 3:
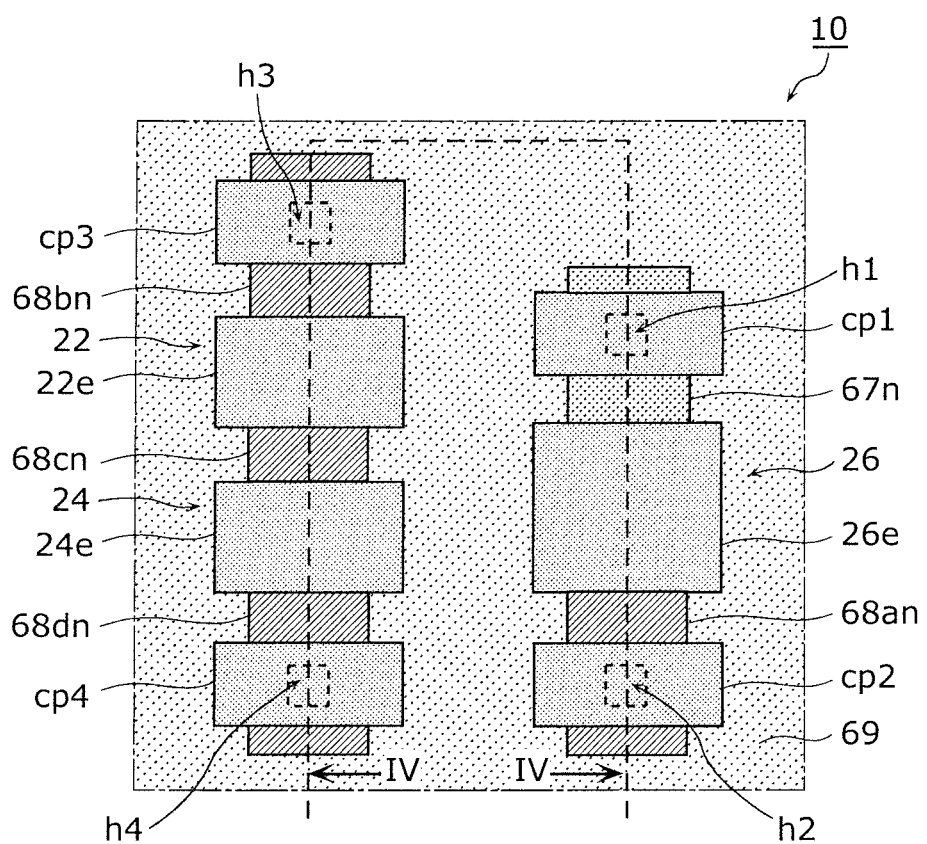
FIG. 3 is a plan view illustrating a layout inside a pixel of the imaging device according to the exemplary embodiment.
Figure 4:
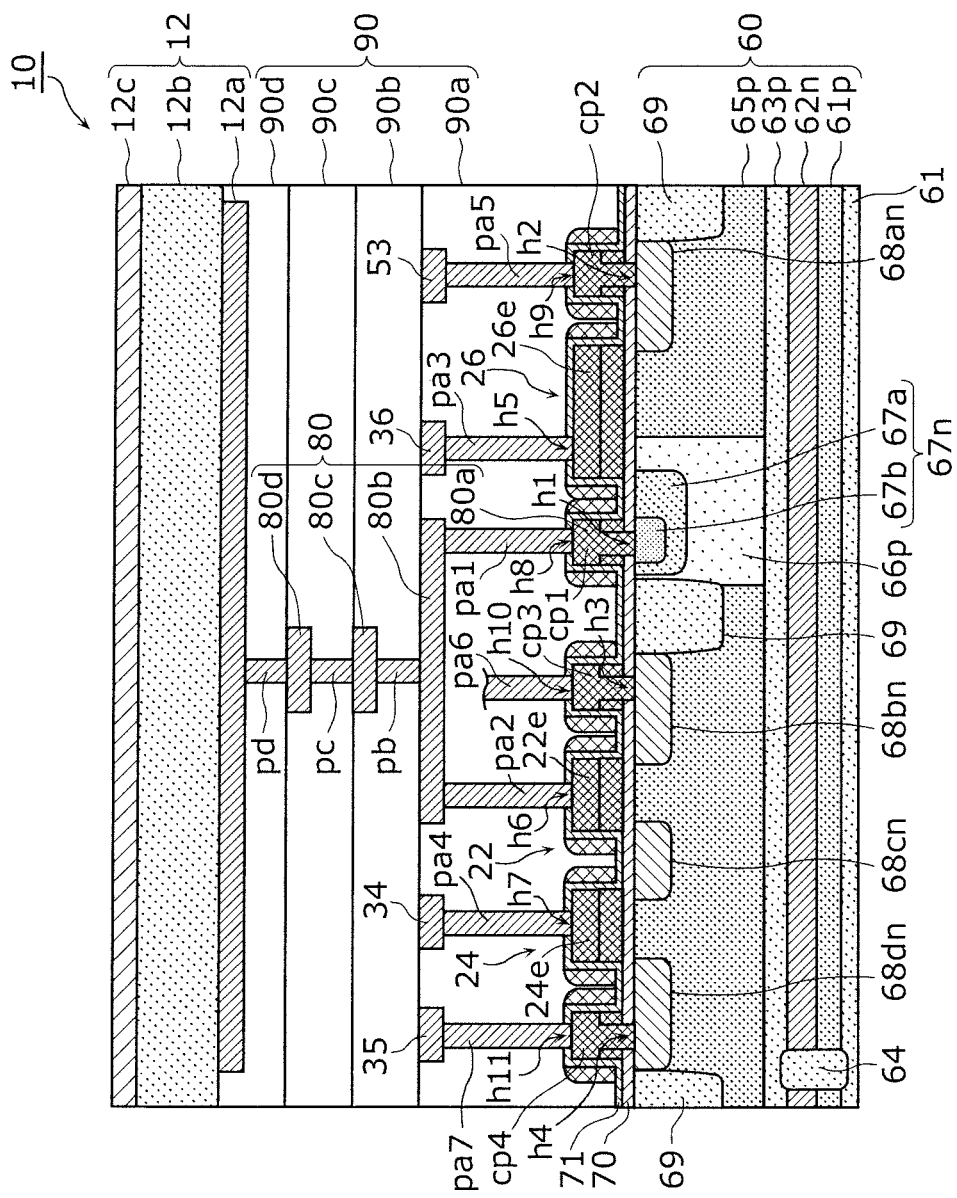
FIG. 4 is a schematic cross-sectional view illustrating a device structure of the imaging device according to the exemplary embodiment.

FIG. 3 is a plan view illustrating a layout inside pixel 10 in imaging device 100 according to this embodiment. FIG. 3 schematically illustrates the disposition of each of elements formed on semiconductor substrate 60 when pixel 10 illustrated in FIG. 4 is viewed in a direction vertical to semiconductor substrate 60. Specifically, FIG. 3 illustrates the disposition of amplifier transistor 22, address transistor 24, and reset transistor 26 that are included in pixel 10. Here, amplifier transistor 22 and address transistor 24 are aligned in a direct line along an up-and-down direction in the drawing.

FIG. 4 is a schematic cross-sectional view illustrating a device structure of pixel 10 in imaging device 100. FIG. 4 is a cross-sectional view illustrating the case where pixel 10 is cut along the line Iv-Iv in FIG. 3 and laid out in a direction of arrow.

Note that in FIG. 3 and FIG. 4, first diffusion region 67*n* which is an n-type impurity region is the drain region of reset transistor 26 and is also a charge accumulation region (FD). First diffusion region 67*n* is located in semiconductor substrate 60 and is one example of a diffusion region electrically connected to photoelectric converter 12.

As illustrated in FIG. 3 and FIG. 4, pixel 10 in imaging device 100 according to this embodiment includes reset transistor 26 including (i) first diffusion region 67*n*, as one of a source and a drain, which includes first conductivity type impurity and accumulates signal charge converted by photoelectric converter 12, and (ii) second diffusion region 68*an*, as the other of the source and the drain, which includes the first conductivity type impurity. Reset transistor 26 is one example of a first transistor that includes a first gate and the first diffusion region as one of a source and a drain.

In this embodiment, the first conductivity type impurity is an n type. In other words, first diffusion region 67*n* and second diffusion region 68*an* are n-type impurity regions. Each of first diffusion region 67*n* and second diffusion region 68*an* is provided at a different location in semiconductor substrate 60.

Furthermore, pixel 10 includes amplifier transistor 22 and address transistor 24. Each of amplifier transistor 22 and address transistor 24 is one example of a second transistor including a second gate and a second diffusion region as one of a source and a drain. Amplifier transistor 22 includes, as one of a source and a drain, second diffusion region 68*bn* including n-type impurity and includes, as the other of the source and the drain, third diffusion region 68*cn* including the n-type impurity. Address transistor 24 includes, as one of a source and a drain, second diffusion region 68*dn* including the n-type impurity, and includes, as the other of the source and the drain, third diffusion region 68*cn* including the n-type impurity. Each of second diffusion regions 68*bn* and 68*dn*, and third diffusion region 68*cn* is one example of an n-type impurity region provided at a different location in semiconductor substrate 60.

In imaging device 100 according to this embodiment, semiconductor substrate 60 includes second conductivity type impurity. The second conductivity type impurity is a conductivity type different from the first conductivity type and is a p-type in this embodiment. Pixel 10 roughly includes a portion of semiconductor substrate 60, photoelectric converter 12 disposed above semiconductor substrate 60, and wiring structure 80, as schematically illustrated in FIG. 4. Wiring structure 80 is provided in interlayer insulating layer 90 formed between photoelectric converter 12 and semiconductor substrate 60, and includes a structure for electrically connecting amplifier transistor 22 and photoelectric converter 12 that are formed on semiconductor substrate 60. Interlayer insulating layer 90 has a laminated structure including four insulating layers of insulating layer 90*a*, insulating layer 90*b*, insulating layer 90*c*, and insulating layer 90*d* (hereinafter abbreviated as insulating layers 90*a* through 90*d* in some cases). Wiring structure 80 includes four wiring layers of wiring layer 80*a*, wiring layer 80*b*, wiring layer 80*c*, and wiring layer 80*d* (hereinafter abbreviated as wiring layers 80*a* through 80*d* in some cases), and plug pa1, plug pa2, plug pa3, plug pa4, plug pa5, plug pa6, plug pa7 (hereinafter abbreviated as plugs pa1 through pa7 in some cases), plug pb, plug pc, and plug pd.

Wiring layer 80*a* is a layer that is the closest to semiconductor substrate 60 among the wiring layers included in wiring structure 80. Specifically, wiring layer 80*a* includes contact plug cp1, contact plug cp2, contact plug cp3, and contact plug cp4 (hereinafter abbreviated as contact plugs cp1 through cp4 in some cases) as well as gate electrode 22*e*, gate electrode 24*e*, and gate electrode 26*e*. Needless to say, the number of insulating layers in interlayer insulating layer 90 and the number of wiring layers in wiring structure 80 are not limited to this example, and any given numbers can be set.

Photoelectric converter 12 is disposed on interlayer insulating layer 90. Photoelectric converter 12 includes pixel electrode 12*a* formed on interlayer insulating layer 90, transparent electrode 12*c* facing pixel electrode 12*a*, and photoelectric conversion layer 12*b* disposed between pixel electrode 12*a* and transparent electrode 12*c*. Photoelectric conversion layer 12*b* in photoelectric converter 12 is composed of an organic material or an inorganic material such as amorphous silicon, and generates positive and negative charges by photoelectric conversion upon receiving incident light via transparent electrode 12*c*. Photoelectric conversion layer 12*b* is typically formed over pixels 10 in a continuous manner. Photoelectric conversion layer 12*b* is formed like one board covering most of the portion of imaging region R1 of semiconductor substrate 60. In other words, photoelectric conversion layer 12*b* is commonly used by pixels 10. Stated differently, photoelectric converter 12 provided for each pixel 10 includes a portion, of photoelectric conversion layer 12*b*, which differs depending on pixel 10. Moreover, photoelectric conversion layer 12*b* may include both a layer composed of an organic material and a layer composed of an inorganic material. Photoelectric conversion layer 12*b* may be separately provided for each pixel 10.

Transparent electrode 12*c* is composed of a transparent conductive material such as indium tin oxide (ITO) and is disposed on the light-receiving side of photoelectric conversion layer 12*b*. Transparent electrode 12*c* is typically formed over pixels 10 in a continuous manner, as is the case of photoelectric conversion layer 12*b*. In other words, transparent electrode 12*c* is commonly used by pixels 10. Stated differently, photoelectric converter 12 provided for each pixel 10 includes a portion, of transparent electrode 12*c*, which differs depending on pixel 10. Transparent electrode 12*c* may be separately provided for each pixel 10.

Transparent electrode 12*c* has a connection to accumulation control line 39 mentioned above although the illustration thereof is omitted in FIG. 4. When imaging device 100 is in operation, it is possible for pixel electrode 12*a* to collect signal charge generated by photoelectric conversion, by controlling the electric potential of accumulation control line 39 so that the electric potential of transparent electrode 12*c* differs from that of pixel electrode 12*a*. For example, the electric potential of accumulation control line 39 is controlled so that the electric potential of transparent electrode 12*c* becomes higher than that of pixel electrode 12*a*. Specifically, a positive voltage of approximately 10 V is applied to accumulation control line 39, for example. This enables pixel electrode 12*a* to collect, as signal charge, holes out of electron-hole pairs generated in photoelectric conversion layer 12*b*. The signal charge collected by pixel electrode 12*a* is accumulated in first diffusion region 67*n* via wiring structure 80.

Pixel electrode 12*a* is composed of, for instance, metal such as aluminum or copper, a metallic nitride, or polysilicon to which conductivity is given by being doped with impurity. Being spatially separated from pixel electrodes 12*a* in other neighboring pixels 10, pixel electrode 12*a* is electrically separated from other pixel electrodes 12*a* in other pixels 10.

Semiconductor substrate 60 includes support substrate 61 and at least one semiconductor layer formed on support substrate 61, as illustrated in FIG. 4. Here, a p-type silicon (Si) substrate is illustrated as an example of support substrate 61. In the example, semiconductor substrate 60 includes p-type semiconductor layer 61*p* on support substrate 61, n-type semiconductor layer 62*n* on p-type semiconductor layer 61*p*, p-type semiconductor layer 63*p* on n-type semiconductor layer 62*n*, and p-type semiconductor layer 65*p* on p-type semiconductor layer 63*p*. P-type semiconductor layer 63*p* is formed above and over support substrate 61. P-type semiconductor layer 65*p* includes p-type impurity region 66*p* whose impurity concentration is lower than that of p-type semiconductor layer 65*p* as well as first diffusion region 67*n*, second diffusion region 68*an*, second diffusion region 68*bn*, second diffusion region 68*dn*, third diffusion region 68*cn*, and device isolation region 69 which are formed in p-type impurity region 66*p*.

Each of p-type semiconductor layer 61*p*, n-type semiconductor layer 62*n*, p-type semiconductor layer 63*p*, and p-type semiconductor layer 65*p* is formed typically by ion implantation of impurity performed on a semiconductor layer formed by epitaxial growth. The impurity concentrations of p-type semiconductor layer 63*p* and p-type semiconductor layer 65*p* are approximately identical to each other and are higher than the impurity concentration of p-type semiconductor layer 61*p*. N-type semiconductor layer 62*n* disposed between p-type semiconductor layer 61*p* and p-type semiconductor layer 63*p* inhibits the flows of minority carriers from support substrate 61 or peripheral circuits 40 and into first diffusion region 67*n* which is a charge accumulation region for accumulating signal charge. When imaging device 100 is in operation, the electric potential of n-type semiconductor layer 62*n* is controlled via a well contact (not shown in the diagram) provided outside imaging region R1 illustrated in FIG. 1.

In the example, semiconductor substrate 60 has p-type region 64 that is provided between p-type semiconductor layer 63p and support substrate 61 so as to penetrate p-type semiconductor layer 61p and n-type semiconductor layer 62n. P-type region 64 has higher impurity concentration than p-type semiconductor layer 63p and p-type semiconductor layer 65p, and electrically connects p-type semiconductor layer 63p and support substrate 61. When imaging device 100 is in operation, the electric potentials of p-type semiconductor layer 63p and supporting substrate 61 are controlled via a substrate contact (not shown in the diagram) provided outside imaging region R1. Disposing p-type semiconductor layer 65p to come into contact with p-type semiconductor layer 63p makes it possible to control the electric potential of p-type semiconductor layer 65p via p-type semiconductor layer 63p when imaging device 100 is in operation.

Amplifier transistor 22, address transistor 24, and reset transistor 26 are formed on semiconductor substrate 60. Reset transistor 26 includes: first diffusion region 67n and second diffusion region 68an; a portion of insulating layer 70 formed on semiconductor substrate 60; and gate electrode 26e on insulating layer 70. Gate electrode 26e is one example of the first gate. To be specific, gate electrode 26e functions as the gate of reset transistor 26. First diffusion region 67n and second diffusion region 68an function as the drain region and the source region of reset transistor 26, respectively. First diffusion region 67n functions as a charge accumulation region for temporarily accumulating signal charge generated by photoelectric converter 12.

Amplifier transistor 22 includes: second diffusion region 68bn and third diffusion region 68cn; a portion of insulating layer 70; and gate electrode 22e on insulating layer 70. Gate electrode 22e is one example of the second gate. To be specific, gate electrode 22e functions as the gate of amplifier transistor 22. Second diffusion region 68bn and third diffusion region 68cn function as the drain region and the source region of amplifier transistor 22, respectively.

Device isolation region 69 is provided between second diffusion region 68bn and first diffusion region 67n. Device isolation region 69 is, for example, a p-type impurity diffusion region. The impurity concentration of device isolation region 69 is higher than those of p-type semiconductor layer 65p and p-type impurity region 66p. Amplifier transistor 22 and reset transistor 26 are electrically separated by device isolation region 69.

First diffusion region 67n is formed in p-type impurity region 66p so that first diffusion region 67n and device isolation region 69 are disposed without contacting each other, as schematically illustrated in FIG. 4. In the case of using a p-type impurity region for device isolation region 69, for example, when first diffusion region 67n and device isolation region 69 are in contact with each other, both p-type impurity concentration and n-type impurity concentration in a junction between first diffusion region 67n and device isolation region 69 become higher. Therefore, leak current due to such high junction concentration easily occurs in the periphery of the junction between first diffusion region 67n and device isolation region 69. Stated differently, by providing first diffusion region 67n and device isolation region 69 so that they do not contact each other, it is possible to inhibit an increase in p-n junction concentration and thus inhibit leak current, even in the case of using, for device isolation region 69, a p-type impurity region having high concentration. In the case of using shallow trench isolation (STI) for device isolation region 69, it is desirable also in this case to place first diffusion region 67n and the STI so that they do not contact each other, to reduce leak current caused by crystal defects at the lateral wall portion of the STI.

Device isolation region 69 is provided also between neighboring pixels 10 and electrically separates signal detection circuits 14 between pixels 10. Here, device isolation region 69 is provided in the periphery of a pair of amplifier transistor 22 and address transistor 24 as well as in the periphery of reset transistor 26.

Address transistor 24 includes: third diffusion region 68cn and second diffusion region 68dn; a portion of insulating layer 70; and gate electrode 24e on insulating layer 70. Gate electrode 24e is one example of the second gate. To be specific, gate electrode 24e functions as the gate of address transistor 24. In the example, address transistor 24 shares third diffusion region 68cn with amplifier transistor 22, and is thus electrically connected to amplifier transistor 22. Third diffusion region 68cn functions as the drain region of address transistor 24, and second diffusion region 68dn functions as the source region of address transistor 24.

In the example, insulating layer 71 is provided to cover gate electrode 26e of reset transistor 26, gate electrode 22e of amplifier transistor 22, and gate electrode 24e of address transistor 24. Insulating layer 71 is, for example, a silicon oxide film. Insulating layer 71 may have a laminated structure including a plurality of insulating layers.

Insulating layer 70 and insulating layer 71 each have a plurality of contact holes. Contact hole h1, contact hole h2, contact hole h3, contact hole h4, contact hole h5, contact hole h6, contact hole h7, contact hole h8, contact hole h9, contact hole h10, and contact hole h11 (hereinafter abbreviated as contact holes h1 to h11 in some cases) are provided in insulating layer 70 and insulating layer 71. Each of contact holes h1 to h4 is formed at a location overlapping first diffusion region 67n, second diffusion region 68an, second diffusion region 68bn, or second diffusion region 68dn when viewed in a direction vertical to semiconductor substrate 60. Contact holes h1 to h4 are through-holes penetrating insulating layer 70. Contact plugs cp1 through cp4 are placed at the locations of contact holes h1 to h4, respectively. The thickness of insulating layer 70 is, for example, 10 nm, but is not limited to such.

Each of contact holes h5 to h7 is formed at a location overlapping gate electrode 26e, gate electrode 22e, or gate electrode 24e when viewed in the direction vertical to semiconductor substrate 60. Contact holes h5 to h7 are through-holes penetrating insulating layer 71. Plug pa3, plug pa2, and plug pa4 are placed at the locations of contact holes h5, h6, and h7, respectively.

Each of contact holes h8 to h11 is formed at a location overlapping contact plug cp1, cp2, cp3, or cp4 when viewed in the direction vertical to semiconductor substrate 60. Contact holes h8 to h11 are through-holes penetrating insulating layer 71. Plug pa1, plug pa5, plug pa6, and plug pa7 are placed at the locations of contact holes h8, h9, h10, and h11, respectively.

In the structure illustrated in FIG. 4, wiring layer 80a includes contact plugs cp1 through cp4 and gate electrodes 22e, 24e, and 26e, and is typically a polysilicon layer doped with n-type impurity. Wiring layer 80a is placed in a location that is the closest to semiconductor substrate 60 among the wiring layers included in wiring structure 80.

Wiring layer 80b and plugs pa1 through pa7 are placed in insulating layer 90a. Wiring layer 80b is disposed in insulating layer 90a and may include, in part, vertical signal line 35, address signal line 34, power wiring 32, reset signal line 36, feedback line 53, etc. that are mentioned above.

Plug pa1 connects contact plug cp1 and wiring layer 80b. Plug pa2 connects gate electrode 22e and wiring layer 80b. In other words, first diffusion region 67n and gate electrode 22e of amplifier transistor 22 are electrically connected with each other via contact plug cp1, plugs pa1 and pa2, and wiring layer 80b.

Plug pa3 connects reset signal line 36 included in wiring 80b to gate electrode 26e. Plug pa4 connects address signal line 34 included in wiring 80b to gate electrode 24e. Plug pa5 connects feedback line 53 included in wiring 80b to contact plug cp2. Plug pa6 connects power wiring 32 (not shown in the diagram) included in wiring 80b to contact plug cp3. Plug pa7 connects vertical signal line 35 included in wiring 80b to contact plug cp4.

With the structure as described above, vertical signal line 35 is connected to second diffusion region 68dn via plug pa7 and contact plug cp4. Address signal line 34 is connected to gate electrode 24e via plug pa4. Power wiring 32 is connected to second diffusion region 68bn via plug pa6 and contact plug cp3. Reset signal line 36 is connected to gate electrode 26e via plug pa3. Feedback line 53 is connected to second diffusion region 68an via plug pa5 and contact plug cp2.

Note that at least one of vertical signal line 35, address signal line 34, power wiring 32, reset signal line 36, and feedback line 53 may be included not in wiring layer 80b, but in wiring layer 80c or 80d.

Plug pb placed in insulating layer 90b connects wiring layer 80b with wiring layer 80c. Likewise, plug pc placed in insulating layer 90c connects wiring layer 80c with wiring layer 80d. Plug pd placed in insulating layer 90d connects wiring layer 80d with pixel electrode 12a of photoelectric converter 12. Wiring layers 80b through 80d as well as plugs pa1 through pa7 and plugs pb through pd are typically composed of metal such as copper or tungsten, a metallic nitride, or a metallic compound such as a metallic oxide.

Plug pa1, plug pa2, plugs pb through pd, wiring layers 80b through 80d, and contact plug cp1 electrically connect photoelectric converter 12 with signal detection circuit 14 formed on semiconductor substrate 60. Plug pa1, plug pa2, plugs pb through pd, wiring layers 80b through 80d, contact plug cp1, pixel electrode 12a of photoelectric converter 12, gate electrode 22e of amplifier transistor 22, and first diffusion region 67n function as charge accumulation nodes for accumulating signal charge generated by photoelectric converter 12.

An n-type impurity region formed on semiconductor substrate 60 is focused here. First diffusion region 67n, among n-type impurity regions formed on semiconductor substrate 60, is provided in p-type impurity region 66p formed in p-type semiconductor layer 65p serving as a p well. First diffusion region 67n is formed in the vicinity of the surface of semiconductor substrate 60, and at least a portion of first diffusion region 67n is located at the surface of semiconductor substrate 60. Junction capacitance formed by a p-n junction between p-type impurity region 66p and first diffusion region 67n functions as capacitance for accumulating at least part of signal charge, and constitutes a part of the charge accumulation nodes.

In the structure illustrated in FIG. 4, first diffusion region 67n includes first region 67a and second region 67b. Second region 67b in first diffusion region 67n is formed in first region 67a and has impurity concentration higher than that of first region 67a. Contact hole h1 is located on second region 67b and contact plug cp1 is connected to second region 67b via contact hole h1.

As described above, disposing p-type semiconductor layer 65p to come into contact with p-type semiconductor layer 63p makes it possible to control the electric potential of p-type semiconductor layer 65p via p-type semiconductor layer 63p when imaging device 100 is in operation. The application of such a structure makes it possible to provide first region 67a in first diffusion region 67n and p-type impurity region 66p which are regions having relatively low impurity concentration, in the periphery of second region 67b in first diffusion region 67n. This is a portion where contact plug cp1 having an electrical connection with photoelectric converter 12 is in contact with semiconductor substrate 60. By relatively increasing the impurity concentration of second region 67b which is a portion connecting contact plug cp1 and semiconductor substrate 60, it is possible to obtain an effect of inhibiting a depletion layer from expanding to the periphery of the connecting portion between contact plug cp1 and semiconductor substrate 60, that is, inhibiting depletion.

Thus, inhibiting depletion in the periphery of the portion where contact plug cp1 and semiconductor substrate 60 are in contact with each other may inhibit leak current due to the defect level of semiconductor substrate 60 at the interface between contact plug cp1 and semiconductor substrate 60 (also referred to as "interface state"). Moreover, by connecting second region 67b having a relatively high impurity concentration to contact plug cp1, an effect of reducing contact resistance can be obtained.

In the example, first region 67a having impurity concentration lower than that of second region 67b is provided between second region 67b in first diffusion region 67n and p-type impurity region 66p and also between second region 67b in first diffusion region 67n and p-type semiconductor layer 65p. Providing first region 67a having a relatively lower impurity concentration than second region 67b in the periphery of second region 67b can alleviate the intensity of an electric field generated by a p-n junction between first diffusion region 67n and p-type semiconductor layer 65p or p-type impurity region 66p. By thus alleviating the electric field intensity, leak current due to the electric field formed by the p-n junction is inhibited.

As described above, a depletion region is formed between first diffusion region 67n and p-type impurity region 66p. In general, crystal defect density in the interior portion of semiconductor substrate 60 is higher than that in the vicinity of the surface of semiconductor substrate 60. Therefore, in the depletion region formed at a p-n junction which is a portion where first diffusion region 67n is joined to p-type impurity region 66p, leak current in a depletion region formed in the vicinity of the surface of semiconductor substrate 60 is greater than that in a depletion region formed at the p-n junction in the interior portion of semiconductor substrate 60.

When the area of the depletion region formed in the junction in the surface of semiconductor substrate 60 (hereinafter referred to as "interface depletion layer") increases, leak current easily increases. Stated differently, reducing the area of the interface depletion layer, which is exposed to the surface of semiconductor substrate 60, makes it possible to inhibit leak current. For example, the area of the interface depletion layer may be reduced to minimum.

Figure 5:
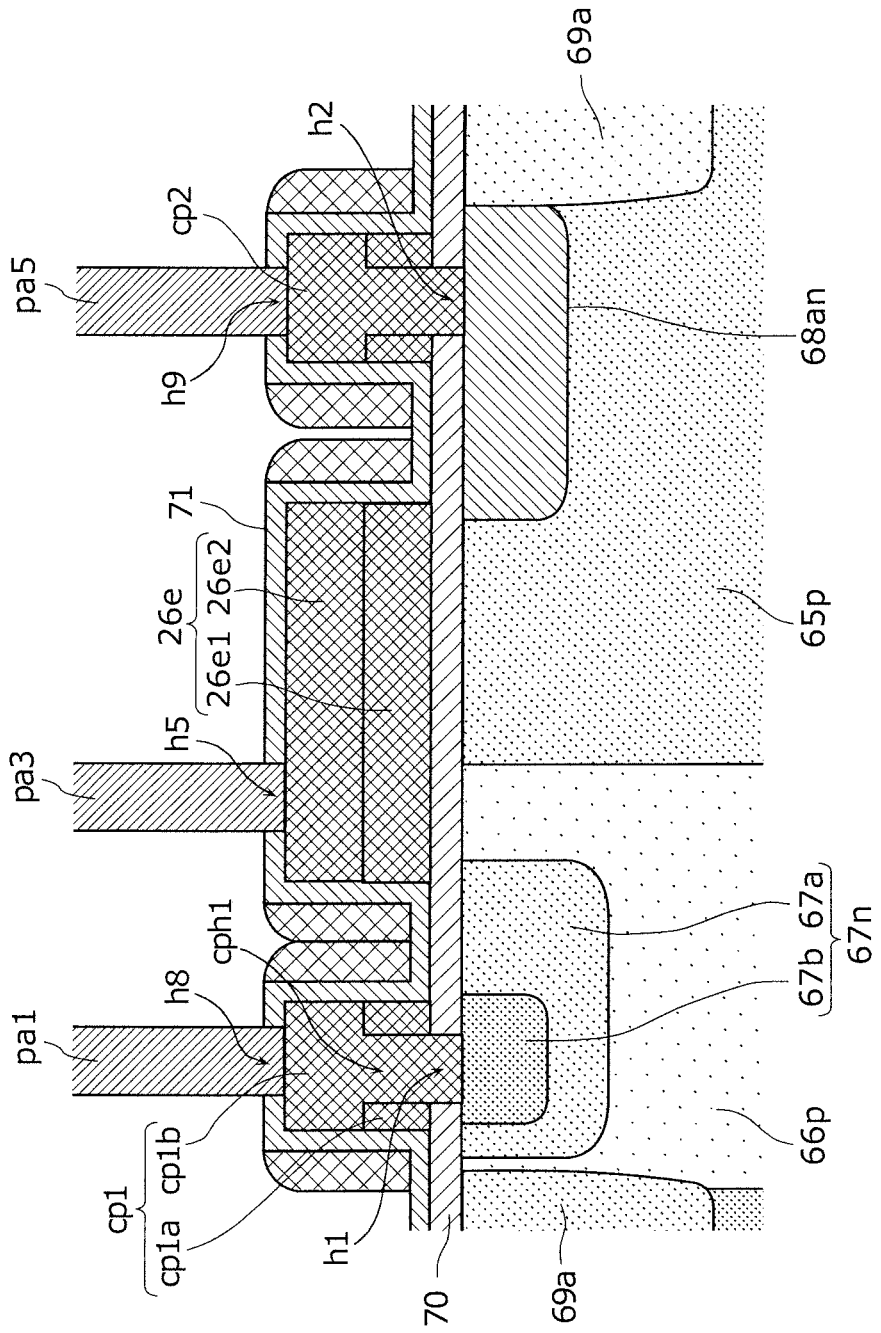
FIG. 5 is a cross-sectional view illustrating a magnified view of the vicinity of contact plugs and a gate electrode of the imaging device according to the exemplary embodiment.

The following describes the detailed structures of contact plug cp1 and gate electrode 26e with reference to FIG. 4 and FIG. 5.

Contact plug cp1 is one example of a first plug including a semiconductor and is directly connected to first diffusion region 67n. Contact plug cp1 is electrically connected to photoelectric converter 12. The expression "electrically connected to photoelectric converter 12" as used herein means having an electric potential that is substantially equal to the electric potential of pixel electrode 12a of photoelectric converter 12. Note that wiring resistance is not taken into consideration.

Contact plug cp2, contact plug cp3, and contact plug cp4 are each one example of a second plug including a semiconductor. Contact plug cp2 is connected to second diffusion region 68an. Contact plug cp3 is connected to second diffusion region 68bn. Contact plug cp4 is connected to second diffusion region 68dn. Contact plug cp2, contact plug cp3, and contact plug cp4 are not electrically connected to photoelectric converter 12.

Contact plugs cp1 through cp4 each have a two-layer structure in which two semiconductor layers are laminated. Likewise, gate electrode 22e, gate electrode 24e, and gate electrode 26e each have the two-layer structure. The height of contact plug cp1 and the height of gate electrode 26e from the surface of semiconductor substrate 60 are equal to each other. Moreover, contact plug cp1 and gate electrode 26e have compositions identical to each other.

FIG. 5 is a cross-sectional view illustrating a magnified view of the vicinity of contact plug cp1 and gate electrode 26e in imaging device 100 according to this embodiment. Specifically, FIG. 5 shows a magnified view of an area including contact plug cp1 and gate electrode 26e in the cross-sectional view illustrated in FIG. 4.

Contact plug cp1 includes first semiconductor layer cp1a and second semiconductor layer cp1b disposed on first semiconductor layer cp1a, as illustrated in FIG. 5.

First semiconductor layer cp1a is provided on insulating layer 70 and is not in contact with semiconductor substrate 60. First semiconductor layer cp1a has through-hole cph1. Through-hole cph1 is connected to contact hole h1 formed in insulating layer 70, as illustrated in FIG. 5. Specifically, through-hole cph1 and contact hole h1 have the same size and shape and are provided at the substantially same location in a plan view.

Second semiconductor layer cp1b is connected to first diffusion region 67n via through-hole cph1. Second semiconductor layer cp1b is formed in a T-shape in the cross-sectional view, as illustrated in FIG. 5. The lateral phase of second semiconductor layer cp1b is, for example, flush with the lateral phase of first semiconductor layer cp1a, but there may be a step therebetween. Insulating layer 71 is provided to cover the upper phase and lateral phase of second semiconductor layer cp1b and the lateral phase of first semiconductor layer cp1a. A portion of the upper phase of second semiconductor layer cp1b is exposed by contact hole h8 provided in insulating layer 71. Plug pa1 is connected to the exposed portion.

Second semiconductor layer cp1b is thus directly connected to both first diffusion region 67n and plug pa1. First semiconductor layer cp1a is neither directly connected to first diffusion region 67n nor to plug pa1.

First semiconductor layer cp1a and second semiconductor layer cp1b are each formed using a conductive semiconductor material such as polysilicon. First semiconductor layer cp1a and second semiconductor layer cp1b each includes first conductivity type impurity. The first conductivity type impurity is, for example, n-type impurity such as phosphorus. First semiconductor layer cp1a and second semiconductor layer cp1b have compositions identical to each other, but may have compositions different from each other. For example, the concentration of impurity included in first semiconductor layer cp1a may be either lower or higher than the concentration of impurity included in second semiconductor layer cp1b.

Gate electrode 26e includes third semiconductor layer 26e1 and fourth semiconductor layer 26e2 disposed on third semiconductor layer 26e1, as illustrated in FIG. 5. Third semiconductor layer 26e1 is provided on insulating layer 70 and is not in contact with semiconductor substrate 60. The lateral phase of third semiconductor layer 26e1 is flush with the lateral phase of fourth semiconductor layer 26e2, but there may be a step therebetween. Insulating layer 71 is provided to cover the upper phase and lateral phase of fourth semiconductor layer 26e2 and the lateral phase of third semiconductor layer 26e1. A portion of the upper phase of fourth semiconductor layer 26e2 is exposed by contact hole h5 provided in insulating layer 71. Plug pa3 is connected to the exposed portion. Fourth semiconductor layer 26e2 is thus directly connected to plug pa3 whereas third semiconductor layer 26e1 is not.

Third semiconductor layer 26e1 and fourth semiconductor layer 26e2 are each formed using a conductive semiconductor material such as polysilicon. Each of third semiconductor layer 26e1 and fourth semiconductor layer 26e2 includes first conductivity type impurity. The first conductivity type impurity is, for example, n-type impurity such as phosphorus. For example, third semiconductor layer 26e1 and fourth semiconductor layer 26e2 have compositions identical to each other. For example, the concentration of impurity included in third semiconductor layer 26e1 may be either lower or higher than the concentration of impurity included in fourth semiconductor layer 26e2.

In this embodiment, first semiconductor layer cp1a and third semiconductor layer 26e1 have compositions identical to each other. Moreover, second semiconductor layer cp1b and fourth semiconductor layer 26e2 have compositions identical to each other. Specifically, first semiconductor layer cp1a, second semiconductor layer cp1b, third semiconductor layer 26e1, and fourth semiconductor layer 26e2 have compositions identical to one another.

The height of first semiconductor layer cp1a and the height of third semiconductor layer 26e1 from the surface of semiconductor substrate 60 are equal to each other. For example, the thickness of first semiconductor layer cp1a and the thickness of third semiconductor layer 26e1 are equal to each other. Moreover, the height of second semiconductor layer cp1b and the height of fourth semiconductor layer 26e2 from the surface of semiconductor substrate 60 are equal to each other. For example, the thickness of second semiconductor layer cp1b and the thickness of fourth semiconductor layer 26e2 are equal to each other. Although the detail will be described later, first semiconductor layer cp1a and third semiconductor layer 26e1 are formed at the same time. Second semiconductor layer cp1b and fourth semiconductor layer 26e2 are formed at the same time. In other words, contact plug cp1 and gate electrode 26e are formed at the same time.

As described above, the height of contact plug cp1 and the height of gate electrode 26e from the surface of semiconductor substrate 60 are equal to each other. Since this makes the portions where plugs are connected in pixel 10 less uneven, it is easier to form plug pa1 and plug pa3. Therefore, the reliability of a connection between plug pa1 and contact plug cp1 and a connection between plug pa3 and gate electrode 26e is enhanced. Accordingly, it is possible to inhibit the occurrence of a contact defect between a plug and a contact plug or a gate electrode, and this in turn makes it possible to achieve a good contact between the plug and the contact plug or the gate electrode.

In the example illustrated in FIG. 4, contact plugs cp1 through cp4 have structures identical to one another. In other words, contact plugs cp1 through cp4 each have the same height from the surface of semiconductor substrate 60. Moreover, contact plugs cp2 through cp4 each have a laminated structure of two semiconductor layers, as is the case of contact plug cp1. First semiconductor layers located in the lower layers of contact plugs cp2 through cp4 have through-holes. Second semiconductor layers located in the upper layers of contact plugs cp2 through cp4 are connected, via the through-holes provided in the first semiconductor layers, to second diffusion region 68an, second diffusion region 68bn, and second diffusion region 68dn, respectively, which are provided in semiconductor substrate 60.

Moreover, gate electrode 22e, gate electrode 24e, and gate electrode 26e have structures identical to one another. Specifically, gate electrode 22e, gate electrode 24e, and gate electrode 26e each have the same height from the surface of semiconductor substrate 60. In the example illustrated in FIG. 4, the heights, from the surface of semiconductor substrate 60, of contact plugs cp1 through cp4 and gate electrode 22e, gate electrode 24e, and gate electrode 26e are equal to one another. This makes it possible to achieve good contacts with all of the contact plugs and the gate electrodes in pixel 10.

Subsequently, a manufacturing method of imaging device 100 according to this embodiment will be described. First, an overview of the manufacturing method of imaging device 100 will be described with reference to FIG. 6, FIG. 7A, and FIG. 7B.

Figure 6:
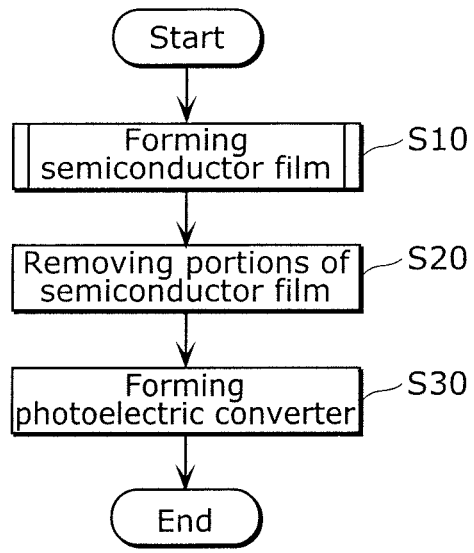
FIG. 6 is a flowchart illustrating a manufacturing method of the imaging device according to the exemplary embodiment.

FIG. 6 is a flowchart illustrating the manufacturing method of imaging device 100 according to this embodiment. In the manufacturing method of imaging device 100, a first process (S10) of forming a semiconductor film above semiconductor substrate 60 including first diffusion region 67n is performed, as shown in FIG. 6. Next, a second process (S20) of forming (i) contact plug cp1 directly connected to first diffusion region 67n and (ii) gate electrode 26e of reset transistor 26 including first diffusion region 67n as one of a source and a drain, by removing portions of the semiconductor film is performed. Then, a third process (S30) of forming photoelectric converter 12 that is electrically connected to first diffusion region 67n and contact plug cp1 and that converts incident light into electric charge is performed.

Figure 7A:
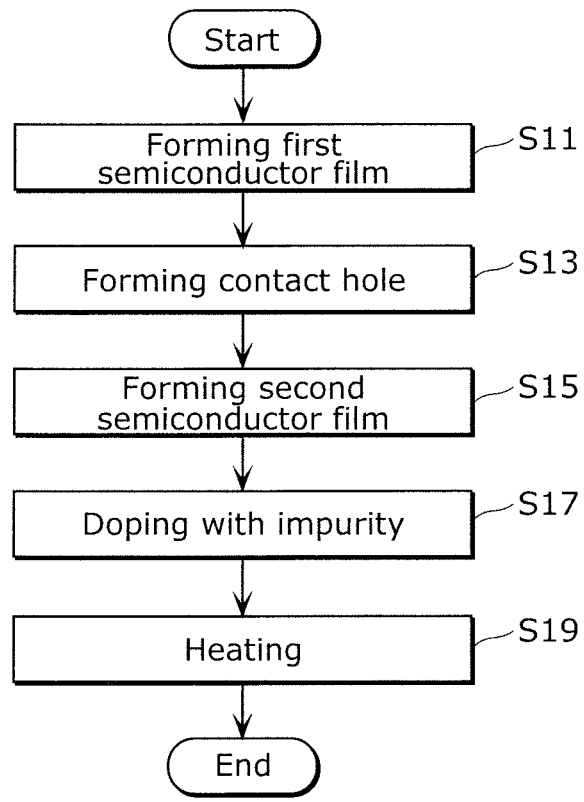
FIG. 7A is a flowchart illustrating an example of a first process of forming a semiconductor film in the manufacturing method of the imaging device according to the exemplary embodiment.
Figure 7B:
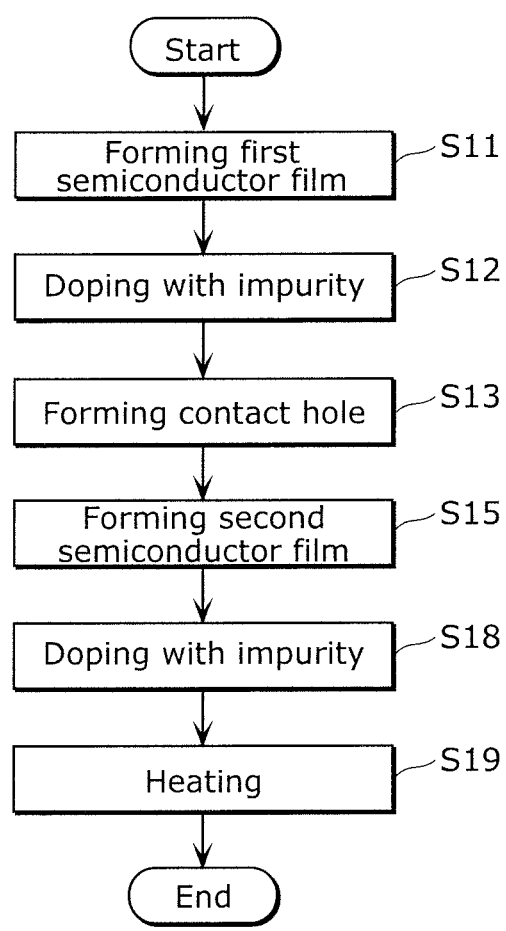
FIG. 7B is a flowchart illustrating another example of the first process of forming a semiconductor film in the manufacturing method of the imaging device according to the exemplary embodiment.

The first process (S10) of forming a semiconductor film includes a plurality of processes. FIG. 7A and FIG. 7B are each a flowchart illustrating a specific example of the first process of forming a semiconductor film in the manufacturing method of imaging device 100 according to this embodiment.

For example, in the first process, a fourth process (S11) of forming a first semiconductor film on an insulating film disposed on semiconductor substrate 60 is firstly performed, as shown in FIG. 7A. Subsequently, a fifth process (S13) of forming contact hole h1 by removing a portion of the insulating film and a portion of the first semiconductor film is performed. Then, a sixth process (S15) of forming a second semiconductor film in contact hole h1 and on the first semiconductor film is performed. Then, a seventh process (S17) of doping the first semiconductor film and the second semiconductor film with first conductivity type impurity is performed. Lastly, a ninth process (S19) of heating semiconductor substrate 60 is performed.

Alternatively, in the first process, a seventh process (S12) of doping the first semiconductor film with first conductivity type impurity may be performed between the fourth process (S11) and the fifth process (S13), as shown in FIG. 7B. An eighth process (S18) of doping the second semiconductor film with the first conductivity type impurity may be performed after the sixth process (S15).

Hereinafter, the detailed processing of each of processes included in the flowcharts shown in FIG. 6, FIG. 7A, and FIG. 7B will be described with reference to FIG. 8A through FIG. 8G.

FIG. 8A through FIG. 8G each are a cross-sectional view for explaining each of processes included in the manufacturing method of imaging device 100 according to this embodiment. Note that the illustrations of support substrate 61 as well as p-type semiconductor layer 61p, n-type semiconductor layer 62n, p-type semiconductor layer 63p, p-type region 64, p-type impurity region 66p, and device isolation region 69 of semiconductor substrate 60 are omitted to prevent the illustrations from becoming complex.

Figure 8A:
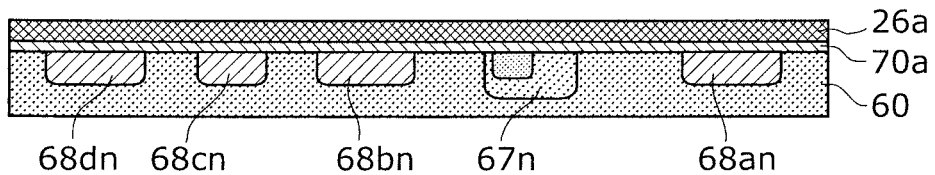
FIG. 8A is a cross-sectional view for explaining a process of forming a first semiconductor film in the manufacturing method of the imaging device according to the exemplary embodiment.

First, insulating film 70a and first semiconductor film 26a are sequentially formed on semiconductor substrate 60 (Step S11 in FIG. 7A or FIG. 7B), as illustrated in FIG. 8A. Note that first diffusion region 67n, second diffusion region 68an, second diffusion region 68bn, second diffusion region 68dn as well as third diffusion region 68cn are formed on semiconductor substrate 60 by ion implantation.

More specifically, insulating film 70a composed of, for instance, a silicon oxide film is formed on semiconductor substrate 60 by plasma chemical vapor deposition (CVD), for instance. Insulating film 70a that has been formed is patterned into a predetermined shape to form insulating layer 70 illustrated in FIG. 4. The thickness of insulating film 70a is, for example, 10 nm.

Next, first semiconductor film 26a is formed on insulating film 70a disposed on semiconductor substrate 60. First semiconductor film 26a composed of a polysilicon film is formed on insulating film 70a by plasma CVD, for instance. First semiconductor film 26a is patterned into a predetermined shape to form first semiconductor layer cp1a and third semiconductor layer 26e1 that are illustrated in FIG. 5, as well as semiconductor layers each located in the lower layer of contact plugs cp2 through cp4, gate electrode 22e, and gate electrode 24e.

Here, first semiconductor film 26a may be doped with first conductivity type impurity, as shown in Step S12 in FIG. 7B. Doping first semiconductor film 26a with n-type impurity such as phosphorus, for example, allows first semiconductor film 26a to have conductivity.

Figure 8B:
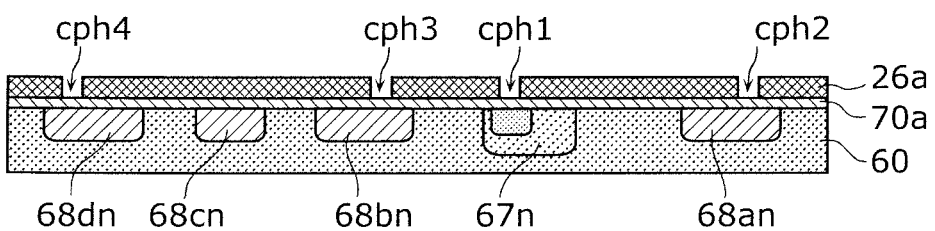
FIG. 8B is a cross-sectional view for explaining a process of partly removing the first semiconductor film in the manufacturing method of the imaging device according to the exemplary embodiment.

Next, the portions of first semiconductor film 26a which are located in first regions are removed, as illustrated in FIG. 8B. The first regions include a region overlapping first diffusion region 67n in a plan view. Specifically, the first regions are each a region overlapping first diffusion region 67n, second diffusion region 68an, second diffusion region 68bn, or second diffusion region 68dn, in the plan view. Each of the first regions is located inner than first diffusion region 67n, second diffusion region 68an, second diffusion region 68bn, or second diffusion region 68dn, and is narrower than the respective regions.

In this way, through-hole cph1, through-hole cph2, through-hole cph3, and through-hole cph4 (hereinafter abbreviated as through-holes cph1 to cph4 in some cases) are formed in first semiconductor film 26a, as illustrated in FIG. 8B. Through-hole cph1 is a through-hole provided in first semiconductor layer cp1a of contact plug cp1. Through-holes cph2 to cph4 are each a through-hole provided in the first semiconductor layer that is the lower layer of each of contact plugs cp2 through cp4, respectively. Insulating film 70a is exposed by each of through-holes cph1 to cph4.

The removal of first semiconductor film 26a is performed by photolithography and etching. Specifically, after the formation of a resist pattern on first semiconductor film 26a, the portions of first semiconductor film 26a are removed by dry etching. When the portions are removed, the surface of insulating film 70a, which is exposed by each of through-holes cph1 to cph4, may be partly removed. After the dry etching, the resist pattern formed on first semiconductor film 26a is removed.

Next, the portions of insulating film 70a which are located in the first regions are removed. Specifically, the portions of insulating film 70a which are exposed by each of through-holes cph1 to cph4 are removed. The removal of insulating film 70a is performed by, for example, wet etching.

Note that since wet etching is isotropic etching, excavations can be easily produced not only in a thickness direction but also in a direction horizontal to a substrate. However, since the thickness of insulating film 70a is extremely thin, that is, as thin as approximately 10 nm, it is possible to remove with accuracy the exposed parts of insulating film 70a inside through-holes cph1 to cph4, with almost no excavation. Wet etching enables high selectivity. Accordingly, it is possible to etch insulating film 70a while hardly etching semiconductor substrate 60, that is, hardly causing any damages to semiconductor substrate 60.

Figure 8C:
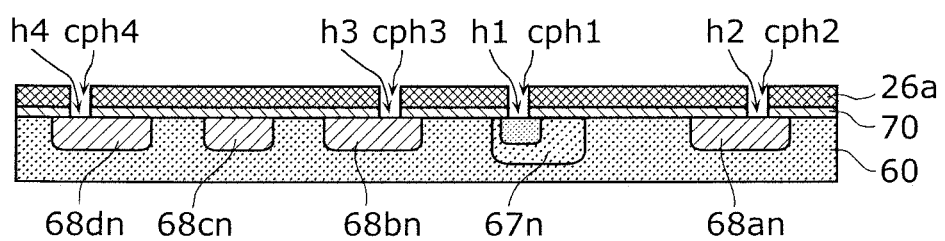
FIG. 8C is a cross-sectional view for explaining a process of forming contact holes in the manufacturing method of the imaging device according to the exemplary embodiment.

Thus, contact holes h1 to h4 are formed (Step S13 in FIG. 7A or FIG. 7B) as illustrated in FIG. 8C. By patterning insulating film 70a, insulating layer 70 provided with contact holes h1 to h4 is formed. First diffusion region 67n, second diffusion region 68an, second diffusion region 68bn, and second diffusion region 68dn are each exposed by contact holes h1 to h4, respectively.

In this embodiment, with the use of wet etching for the removal of insulating film 70a, it is possible to inhibit damages given to semiconductor substrate 60 compared to the case of using dry etching. Since the formation of defects on the surface of first diffusion region 67n is inhibited, leak current to and from first diffusion region 67n can be inhibited. The same applies to second diffusion region 68an, second diffusion region 68bn, and second diffusion region 68dn.

Figure 8D:
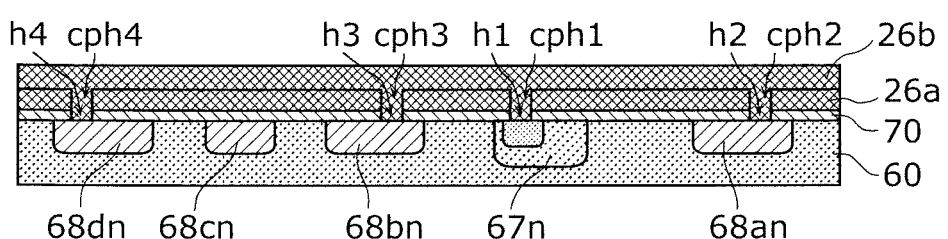
FIG. 8D is a cross-sectional view for explaining a process of forming a second semiconductor film in the manufacturing method of the imaging device according to the exemplary embodiment.

Next, second semiconductor film 26b is formed in contact holes h1 to h4 and also on first semiconductor film 26a, as illustrated in FIG. 8D. Second semiconductor film 26b composed of a polysilicon film is formed, for example, over the entire surface of first semiconductor film 26a by plasma CVD, for instance. Each of contact holes h1 to h4 and through-holes cph1 to cph4 is filled with second semiconductor film 26b.

Here, second semiconductor film 26b and/or first semiconductor film 26a are/is doped with first conductivity type impurity, as shown in Step S17 in FIG. 7A or Step S18 in FIG. 7B. Doping second semiconductor film 26b and/or first semiconductor film 26a with n-type impurity such as phosphorus, for example, allows second semiconductor film 26b and/or first semiconductor film 26a to have conductivity.

Furthermore, after the doping of second semiconductor film 26b and/or first semiconductor film 26a with the impurity, semiconductor substrate 60 is heated (Step S19 in FIG. 7A or FIG. 7B). With the heating of semiconductor substrate 60, the impurity with which first semiconductor film 26a and/or second semiconductor film 26b are/is doped diffuses inside the films/film so that the impurity is evenly provided. This can enhance the conductivities of first semiconductor film 26a and/or second semiconductor film 26b.

After going through the above-described processes, the first process (Step S10 in FIG. 6) of forming a semiconductor film, that is, the laminated structure of first semiconductor film 26a and second semiconductor film 26b above semiconductor substrate 60, is ended.

Figure 8E:
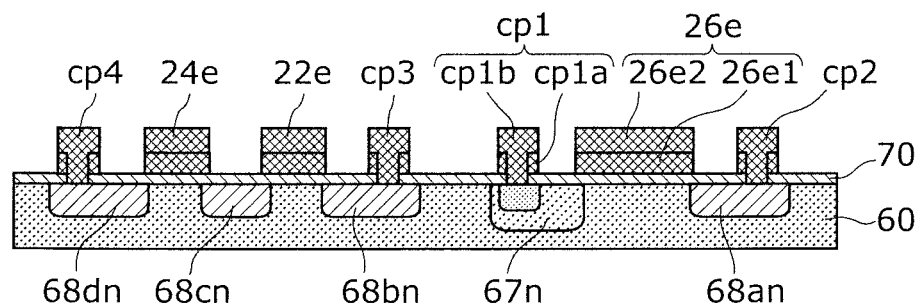
FIG. 8E is a cross-sectional view for explaining a process of partly removing the semiconductor film in the manufacturing method of the imaging device according to the exemplary embodiment.

Next, contact plug cp1 and gate electrode 26e are formed by removing the portions of the semiconductor film (Step S20 in FIG. 6), as illustrated in FIG. 8E. Specifically, by removing the portions, of first semiconductor film 26a and second semiconductor film 26b, which are located in second regions different from the first regions, contact plug cp1 and gate electrode 26e are formed.

The second regions are regions other than regions in which contact plugs cp1 through cp4 as well as gate electrodes 22e, 24e, and 26e are to be formed. The second regions are, for example, regions each overlapping device isolation region 69 in a plan view. By removing the portions of first semiconductor film 26a and second semiconductor film 26b, which are located in the second regions, contact plugs cp1 through cp4 as well as gate electrodes 22e, 24e, and 26e are formed.

The removal of first semiconductor film 26a and second semiconductor film 26b is performed by, for example, photolithography and etching. Specifically, after forming a resist pattern on second semiconductor film 26b, the portions of second semiconductor film 26b and first semiconductor film 26a are removed all at once by dry etching. When the portions are removed, the surface of insulating layer 70 may be partly removed. After the dry etching, the resist pattern formed on second semiconductor film 26b is removed.

Figure 8F:
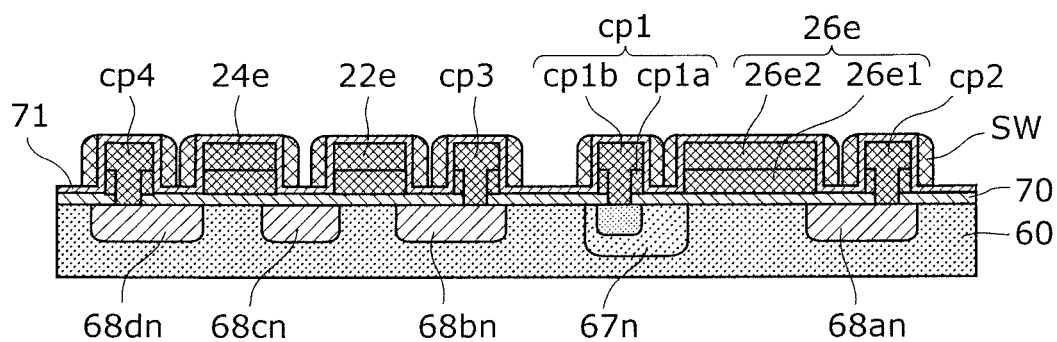
FIG. 8F is a cross-sectional view for explaining a process of forming side walls and an insulating film in the manufacturing method of the imaging device according to the exemplary embodiment.

Next, insulating layer 71 and side walls SW are formed as illustrated in FIG. 8F. A silicon oxide film is formed by plasma CVD in such a manner to cover the entire surface of contact plugs cp1 through cp4 as well as gate electrodes 22e, 24e, and 26e, to form insulating layer 71. Furthermore, by forming a silicon oxide film or a silicon nitride film on insulating layer 71 by plasma CVD and subsequently etching back the film, side walls SW are formed. Note that the method of forming insulating layer 71 and side walls SW is not particularly limited to the method described above.

Figure 8G:
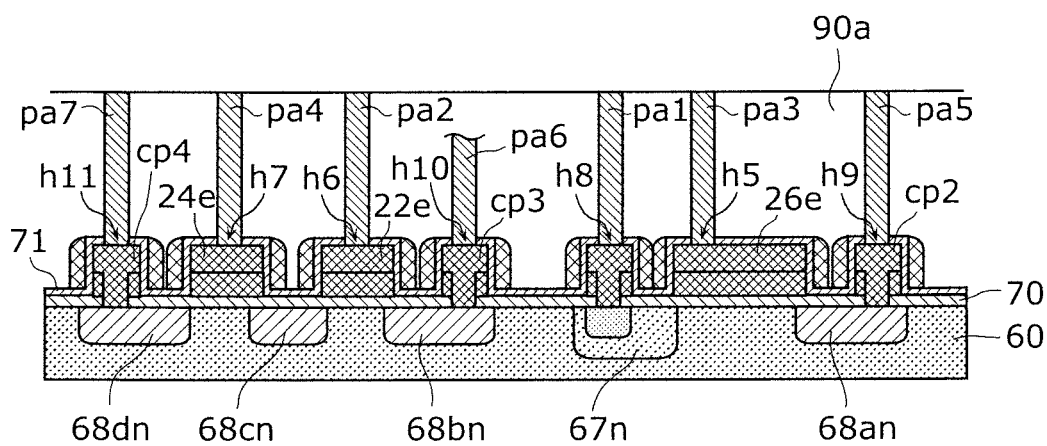
FIG. 8G is a cross-sectional view for explaining a process of forming an interlayer insulating layer and plugs in the manufacturing method of the imaging device according to the exemplary embodiment.

Next, plugs pa1 through pa1 each connected to the corresponding one of contact plugs cp1 through cp4 and gate electrodes 22e, 24e, and 26e are formed after the formation of insulating layer 90a, as illustrated in FIG. 8G. Specifically, after a silicon oxide film is formed as insulating layer 90a by plasma CVD, through-holes penetrating insulating layer 90a and insulating layer 71 are formed by photolithography and etching. By filling the through-holes with a metallic material such as copper, plugs pa1 through pa1 are formed.

Hereinafter, interlayer insulating layer 90 and wiring structure 80 are formed by sequentially forming wiring layer 80b, insulating layer 90b, plug pb, wiring layer 80c, insulating layer 90c, plug pc, wiring layer 80d, insulating layer 90d, and plug pd. Lastly, photoelectric converter 12 is formed by sequentially forming pixel electrode 12a, photoelectric conversion layer 12b, and transparent electrode 12c (Step S30 in FIG. 6).

Through the above-described processes, imaging device 100 according to this embodiment is manufactured.

In this embodiment, contact plug cp1 and gate electrode 26e are formed at the same time. Assuming that gate electrode 26e is formed before contact plug cp1, it becomes difficult, in some cases, to perform micro-fabrication on contact plug cp1 due to unevenness caused by gate electrode 26e. Due to this, contact plug cp1 may not be formed into a shape as designed, and this could be one of the factors for characteristic defects, such as an increase in leak current or in contact resistance. The same applies to the case where contact plug cp1 is formed before gate electrode 26e. According to this embodiment, since gate electrode 26e and contact plug cp1 are formed at the same time, it is possible to appropriately form both gate electrode 26e and contact plug cp1, and this in turn makes it possible to inhibit the occurrence of characteristic defects.

According to this embodiment, not only contact plug cp1 and gate electrode 26e, but contact plugs cp1 through cp4 and gate electrodes 22e, 24e, and 26e are formed at the same time. This makes it all the more possible to inhibit the occurrence of characteristic defects in pixel 10.

Other Embodiments

Although the imaging device and manufacturing method thereof according to the present disclosure have been described based on an exemplary embodiment, the present disclosure shall not be limited to the exemplary embodiment. Embodiments arrived at by a person skilled in the art making various modifications to the exemplary embodiment as well as embodiments realized by arbitrarily combining one or more elements in the exemplary embodiment which do not depart from the essence of the present disclosure are included in the present disclosure.

Photoelectric converter 12 may be, for example, a photodiode formed in semiconductor substrate 60. In other words, imaging device 100 need not be a laminated imaging device.

The first conductivity type impurity with which contact plug cp1 and gate electrode 26e are doped may be, for example, p-type impurity. Contact plug cp1 and gate electrode 26e may be, for example, silicon layers including p-type impurity such as boron.

For example, contact plug cp1 and gate electrode 26e may have different compositions. Specifically, the concentration of impurity included in contact plug cp1 may be different from the concentration of impurity included in gate electrode 26e. Moreover, impurity included in contact plug cp1 and impurity included in gate electrode 26e may be of different types. The same applies to contact plug cp2 and gate electrode 26e, contact plug cp3 and gate electrode 22e, and contact plug cp4 and gate electrode 24e. At least one of first semiconductor layer cp1a, second semiconductor layer cp1b, third semiconductor layer 26e1, and fourth semiconductor layer 26e2 may have a composition different from that of the others.

For example, the thickness of first semiconductor layer cp1a may be different from that of third semiconductor layer 26e1. Likewise, the thickness of second semiconductor layer cp1b may be different from that of fourth semiconductor layer 26e2. For example, the thickness of first semiconductor layer cp1a may be less than that of third semiconductor layer 26e1, and the thickness of second semiconductor layer cp1b may be greater than that of fourth semiconductor layer 26e2. What is required here is that adjusting the thickness of each of the layers allows the height of contact plug cp1 and the height of gate electrode 26e to be equal.

For example, the heating process (Step S19 in FIG. 7A or FIG. 7B) may be performed after the second process (Step S20 in FIG. 6). Moreover, the heating process may be performed plural times after the seventh process of doping the first and second semiconductor films with impurity.

According to the embodiment and variation thereof of the present disclosure, the influence of leak current can be reduced, and therefore, an imaging device capable of imaging with high image quality is provided. Note that each of amplifier transistor 22, address transistor 24, and reset transistor 26 described above may be an n-channel MOSFET or a p-channel MOSFET. When each of these transistors is a p-channel MOSFET, the first conductivity type impurity is p-type impurity and the second conductivity type impurity is n-type impurity. It is not necessary for all of the transistors to be either n-channel MOSFETs or p-channel MOSFETs. When each of transistors in a pixel is an n-channel MOSFET and electrons are used for signal charges, the location of a source and the location of a drain in each of the transistors may be replaced with each other.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The present disclosure provides an imaging device capable of inhibiting the influence of dark current and imaging with high image quality. The imaging device according to one or more exemplary embodiments disclosed herein is applicable to, for example, image sensors and digital cameras, and can be used in medical cameras, robot cameras, security cameras, cameras used on-board a vehicle, etc.

The invention claimed is:

1. An imaging device, comprising:
a semiconductor substrate; and
pixels, wherein
each of the pixels includes:
a photoelectric converter that converts incident light into electric charge;
a diffusion region provided in the semiconductor substrate and electrically connected to the photoelectric converter;
a first transistor including a gate, and the diffusion region as one of a source and a drain; and
a plug that is directly connected to the diffusion region, is electrically connected to the photoelectric converter, and includes a semiconductor, and
a height of the plug and a height of the gate from a surface of the semiconductor substrate are equal to each other.

2. The imaging device according to claim 1, wherein the plug and the gate have compositions identical to each other.

3. The imaging device according to claim 1, wherein the plug includes:
a first layer including a semiconductor; and
a second layer disposed on the first layer and including a semiconductor.

4. The imaging device according to claim 3, wherein the gate includes:
a third layer including a semiconductor; and
a fourth layer disposed on the third layer and including a semiconductor.

5. The imaging device according to claim 4, wherein
the first layer and the third layer have compositions identical to each other, and
the second layer and the fourth layer have compositions identical to each other.

6. The imaging device according to claim 4, wherein
the first layer, the second layer, the third layer, and the fourth layer have compositions identical to one another.

7. The imaging device according to claim 3, wherein
the first layer includes a through-hole, and
the second layer is directly connected to the diffusion region via the through-hole.

8. A method for manufacturing an imaging device, the method comprising:
a first process of forming a semiconductor film above a semiconductor substrate including a diffusion region;
a second process of forming (i) a plug directly connected to the diffusion region and (ii) a gate of a first transistor including the diffusion region as one of a source and a drain, by removing a portion of the semiconductor film; and
a third process of forming a photoelectric converter that is electrically connected to the diffusion region and the plug, and converts incident light into electric charge, wherein
a height of the plug and a height of the gate from a surface of the semiconductor substrate are equal to each other.

9. The manufacturing method according to claim 8, wherein
the first process includes:
a fourth process of forming a first semiconductor film on an insulating film disposed on the semiconductor substrate;
a fifth process of forming a contact hole by removing a portion of the insulating film and a portion of the first semiconductor film which are located in a first region overlapping the diffusion region in a plan view; and
a sixth process of forming a second semiconductor film in the contact hole and on the first semiconductor film, and
in the second process, the plug and the gate are formed by removing portions of the first semiconductor film and portions of the second semiconductor film, which are located in a second region different from the first region.

10. The manufacturing method according to claim 9, wherein
in the fifth process, the portion of the first semiconductor film in the first region is removed by dry etching and the portion of the insulating film in the first region is removed by wet etching.

11. The manufacturing method according to claim 9, wherein
the first process further includes a seventh process of doping the first semiconductor film and the second semiconductor film with first conductivity type impurity, which is performed after the sixth process.

12. The manufacturing method according to claim 9, wherein
the first process further includes a seventh process of doping the first semiconductor film with first conductivity type impurity, which is performed between the fourth process and the fifth process.

13. The manufacturing method according to claim 12, wherein
the first process further includes an eighth process of doping the second semiconductor film with the first conductivity type impurity, which is performed after the sixth process.

14. The manufacturing method according to claim 11, wherein
the first process further includes a ninth process of heating the semiconductor substrate, which is performed later than the seventh process.

15. The manufacturing method according to claim 9, wherein
the first semiconductor film and the second semiconductor film are each a polysilicon film.

* * * * *